(12) United States Patent
Meiser et al.

(10) Patent No.: US 9,728,580 B2
(45) Date of Patent: Aug. 8, 2017

(54) POWER TRANSISTOR WITH INTEGRATED TEMPERATURE SENSOR ELEMENT, POWER TRANSISTOR CIRCUIT, METHOD FOR OPERATING A POWER TRANSISTOR, AND METHOD FOR OPERATING A POWER TRANSISTOR CIRCUIT

(71) Applicant: Infineon Technologies AG, Neubiberg (DE)

(72) Inventors: Andreas Meiser, Sauerlach (DE); Steffen Thiele, Munich (DE)

(73) Assignee: Infineon Technologies AG, Neubiberg (DE)

( * ) Notice: Subject to any disclaimer, the term of this patent is extended or adjusted under 35 U.S.C. 154(b) by 842 days.

(21) Appl. No.: 13/892,600

(22) Filed: May 13, 2013

(65) Prior Publication Data

US 2014/0334522 A1    Nov. 13, 2014

(51) Int. Cl.
*G01K 7/01* (2006.01)
*H01L 27/16* (2006.01)

(52) U.S. Cl.
CPC ............ *H01L 27/16* (2013.01); *G01K 7/01* (2013.01)

(58) Field of Classification Search
CPC ......... H01L 31/00; H01L 29/06; H01L 29/76; G01K 7/01
USPC ........ 374/178; 257/481, 234, 212, 262, 279, 257/280; 702/130
See application file for complete search history.

(56) References Cited

U.S. PATENT DOCUMENTS

| | | | | |
|---|---|---|---|---|
| 4,730,228 A | * | 3/1988 | Einzinger | G01K 3/005 257/470 |
| 4,769,560 A | * | 9/1988 | Tani | H03F 3/3435 257/568 |
| 5,539,238 A | * | 7/1996 | Malhi | H01L 29/0615 257/335 |
| 5,661,322 A | * | 8/1997 | Williams | H01L 27/0255 257/327 |
| 6,013,934 A | * | 1/2000 | Embree | H01L 27/0248 257/226 |
| 6,046,470 A | | 4/2000 | Williams et al. | |
| 6,876,043 B1 | | 4/2005 | Sander | |

(Continued)

FOREIGN PATENT DOCUMENTS

JP      2009188178 A  *  8/2009
WO         9713279 A1     4/1997

*Primary Examiner* — Gail Kaplan Verbitsky
(74) *Attorney, Agent, or Firm* — Murphy, Bilak & Homiller, PLLC (57) ABSTRACT

A power transistor has a semiconductor body with a bottom side and top side spaced distant from the bottom side in a vertical direction. The semiconductor body includes a plurality of transistor cells, a source zone of a first conduction type, a body zone of a second conduction type, a drift zone of the first conduction type, a drain zone, and a temperature sensor diode having a pn-junction between an n-doped cathode zone and a p-doped anode zone. The power transistor also has a drain contact terminal on the top side, a source contact terminal on the bottom side, a gate contact terminal, and a temperature sense contact terminal on the top side. Depending on the first and second conduction types the anode or cathode zone is electrically connected to the source contact terminal and the other diode zone is electrically connected to the temperature sense contact terminal.

27 Claims, 8 Drawing Sheets

(56) References Cited

U.S. PATENT DOCUMENTS

| | | | | |
|---|---|---|---|---|
| 7,709,891 B2* | 5/2010 | Mauder | | H01L 29/0653 257/341 |
| 7,800,195 B2* | 9/2010 | Ozoe | | G01K 7/015 257/467 |
| 7,835,129 B2* | 11/2010 | Thiele | | H03K 17/0822 361/103 |
| 8,614,480 B2* | 12/2013 | Wang | | H01L 27/0629 257/329 |
| 8,780,517 B2 | 7/2014 | Fukami | | |
| 8,970,259 B2* | 3/2015 | Mori | | H03K 17/145 327/108 |
| 2007/0228496 A1* | 10/2007 | Rochefort | | H01L 29/0634 257/409 |
| 2008/0164497 A1* | 7/2008 | von Borcke | | H03K 17/14 257/252 |
| 2008/0265320 A1* | 10/2008 | Mauder | | H01L 29/0653 257/341 |
| 2009/0057713 A1* | 3/2009 | Hirler | | H01L 29/1095 257/143 |
| 2010/0321092 A1* | 12/2010 | Momota | | H01L 29/0696 327/512 |
| 2012/0133388 A1* | 5/2012 | Bernoux | | H01L 29/7815 324/762.01 |
| 2012/0242376 A1* | 9/2012 | Ose | | H03K 17/14 327/109 |
| 2012/0273879 A1* | 11/2012 | Mallikarjunaswamy | | H01L 29/4175 257/335 |
| 2013/0249602 A1* | 9/2013 | Mauder | | H01L 29/7801 327/108 |
| 2014/0001528 A1* | 1/2014 | Pfirsch | | H01L 29/0634 257/300 |
| 2014/0103902 A1* | 4/2014 | Otremba | | H01L 23/49524 324/76.11 |
| 2014/0212289 A1* | 7/2014 | Thogersen | | G01K 7/01 416/146 R |
| 2014/0319540 A1* | 10/2014 | Sugimoto | | H01L 29/0653 257/77 |
| 2015/0162324 A1* | 6/2015 | Mauder | | H01L 29/7801 257/337 |
| 2015/0263611 A1* | 9/2015 | Iwamizu | | H02M 3/07 327/109 |
| 2016/0011058 A1* | 1/2016 | Kiep | | G01K 7/01 374/178 |

* cited by examiner

POWER TRANSISTOR WITH INTEGRATED TEMPERATURE SENSOR ELEMENT, POWER TRANSISTOR CIRCUIT, METHOD FOR OPERATING A POWER TRANSISTOR, AND METHOD FOR OPERATING A POWER TRANSISTOR CIRCUIT

TECHNICAL FIELD

Embodiments of the present invention relate to a power transistor with integrated temperature sensor, to a power transistor circuit, to a method for operating a power transistor, and to a method for operating a power transistor circuit.

BACKGROUND

Transistors, such as MOSFETs or IGBTs etc., are widely used for controlling or switching loads in different kinds of applications, such as in inverters, voltage regulators, current regulators, or drive circuits for driving electric loads, such as lamps, valves, motors, etc. Such transistors usually are n- or p-channel power transistors having a plurality of identical transistors cells arranged in a transistor cell field and electrically connected in parallel.

During operation, an electric current through a load path of the transistor is switched on or off or adjusted to a certain value by applying a control voltage to a contact terminal. The load path is formed between a source or emitter electrode on the one hand and a drain or collector electrode on the other hand.

Depending on the particular application in which a power transistor is used, the load path is usually connected in series with a load to be controlled or with a further power transistor between a positive and a negative electric supply potential, e.g. as bridge configuration. In such arrangements, the power transistor is either employed as a high-side (HS) transistor or as a low-side (LS) transistor. In case of a HS transistor, its load path is electrically connected between the positive supply potential and the load or the further power transistor. Accordingly, in case of a LS transistor, its load path is electrically connected between the negative supply potential and the load or the further power transistor.

Currently available power transistors may be operated at high temperatures, for instance at more than 150° C., at more than 175° C., or even at more than 200° C. However, if a power transistor's temperature exceeds a maximum permissible temperature, the transistor can be damaged or destroyed. Hence, in order to detect the transistor's temperature, many modern power transistors like those described in U.S. Pat. No. 6,876,043 B1 or in U.S. Pat. No. 7,835,129 B2 have an integrated temperature sensor element formed by the drain-body-diode, wherein the cathode of the drain-body-diode is connected to drain. In case of an n-channel transistor the use in HS configuration is unproblematic. In LS configuration however, there is always a heating-up if the load path of the power transistor is switched on and an electric current passes through it. In that on-state, the difference between the drain- and source-potentials of the power transistor amounts to only some 100 mV which is not sufficient for reasonably evaluating the signal. Hence, in such a configuration a reasonable temperature measurement is only available if the power transistor is switched off, that is, in a state in which the transistor cools down.

Therefore, there is a need for a solution that allows for detecting the temperature of a power transistor even in state in which the power transistor is switched on.

SUMMARY

A first embodiment relates to a power transistor the transistor has a semiconductor body with a bottom side and with a top side spaced distant from the bottom side in a vertical direction. A plurality of transistor cells is arranged in the semiconductor body. Further, in the semiconductor body are formed a source zone of a first conduction type, a body zone of a second conduction type complementary to the first conduction type, a drift zone of the first conduction type, a drain zone, and a temperature sensor diode that has a pn-junction formed between an n-doped cathode zone and a p-doped anode zone. Then, the power transistor has a drain contact terminal arranged on the top side, a source contact terminal arranged on the bottom side, a gate contact terminal, and a temperature sense contact terminal arranged on the top side and dielectrically insulated from the drain contact terminal. If (I) the first conduction type is 'n' and the second conduction type is the anode zone is electrically connected to the source contact terminal and the cathode zone is electrically connected to the temperature sense contact terminal; or, otherwise, if (II) the first conduction type is 'p' and the second conduction type is 'n', the cathode zone is electrically connected to the source contact terminal, and the anode zone is electrically connected to the temperature sense contact terminal.

The power transistor may be any kind of power transistor, in particular any kind of field effect transistor having an electrically insulated gate like a MOSFET (metal oxide semiconductor field effect transistor) or an IGBT (insulated gate bipolar transistor). It is further to be noted that, in the sense of the present invention, the term "source" also includes "emitter", and the term "drain" also includes "collector". Accordingly, the term "source contact terminal" also includes "emitter contact terminal", and the term "drain contact terminal" includes "collector contact terminal".

A second embodiment relates to a method for operating such a power transistor according to the first embodiment, in which method the temperature dependent voltage drop across the pn-junction (18) is detected.

A third embodiment relates to a power transistor circuit with a power transistor according to the first embodiment, and an evaluation unit configured to evaluate a temperature dependent voltage drop across the pn-junction. The evaluation unit has an input that is electrically connected to the temperature sense contact terminal.

A fourth embodiment relates to a power transistor circuit with a power transistor according to the first embodiment, and an electronic circuit with a first evaluation unit and a second evaluation unit. The first evaluation unit is designed to evaluate a temperature dependent voltage drop across the pn-junction. Accordingly, the second evaluation unit is designed to evaluate a temperature dependent voltage drop across the pn-junction. The electronic circuit further has a first switch, a second switch, a first current source and a second current source. The first current source and the second current source are electrically connected in series between the first switch and the second switch. The first switch has a closed state in which it electrically connects the first current source with the temperature sense contact terminal. The first switch has also an open state in which the first current source is electrically disconnected from the temperature sense contact terminal. Accordingly, the second switch has a closed state in which it electrically connects the second current source with the temperature sense contact terminal. The second switch also comprises an open state in which the second current source is electrically disconnected from the temperature sense contact terminal.

A fifth embodiment relates to a method for operating a power transistor circuit in which method a power transistor circuit according to the fourth embodiment is provided. The method further includes one or both of the following steps:

(c1) detecting a temperature dependent voltage drop across the pn-junction with the first switch being in its closed state and with the second switch being in its open state; and (c2) detecting a temperature dependent voltage drop across the pn-junction with the second switch being in its closed state and with the first switch being in its open state.

Those skilled in the art will recognize additional features and advantages upon reading the following detailed description, and upon viewing the accompanying drawings.

BRIEF DESCRIPTION OF THE DRAWINGS

Examples will now be explained with reference to the drawings. The drawings serve to illustrate the basic principle, so that only aspects necessary for understanding the basic principle are illustrated. The drawings are not to scale. In the drawings the same reference characters denote like features.

DETAILED DESCRIPTION

In the following Detailed Description, reference is made to the accompanying drawings, which form a part thereof, and in which is shown by way of illustration specific embodiments in which the invention may be practiced. In this regard, directional terminology, such as "top", "bottom", "front", "back", "leading", "trailing" etc., is used with reference to the orientation of the Figures being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims. It is to be understood that the features of the various exemplary embodiments described herein may be combined with each other, unless specifically noted otherwise.

Figure 1:
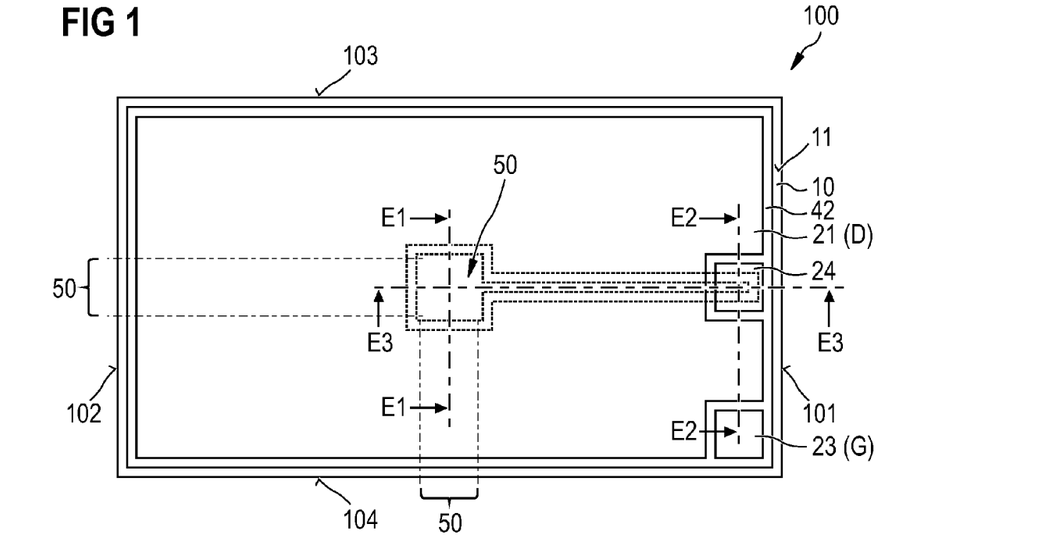
FIG. 1 is a top view of an embodiment of a power transistor that illustrates the location of the temperature sensor diode in the semiconductor body.

FIG. 1 is a top view of a power transistor 100. The transistor 100 has a semiconductor body 10 that includes an arbitrary semiconductor material like silicon (Si), silicon carbide (SiC), gallium arsenide (GaAs), gallium phosphide (GaP), or any other IV-IV, III-V, II-VI semiconductor material. The semiconductor body 10 has a top side 11 on which a drain (D) contact terminal 21, a gate (G) contact terminal 23 and a temperature sense contact terminal 24 are arranged electrically insulated from one another. The drain contact terminal 21 may be a continuous layer without through holes. A temperature sensor diode 50 is located in the semiconductor body 10 distant from the lateral edges 101, 102, 103, 104 of the semiconductor body 10. The location of the temperature sensor diode 50 is indicated by broken lines as it is hidden out of view underneath the drain contact terminal 21.

Figure 2:
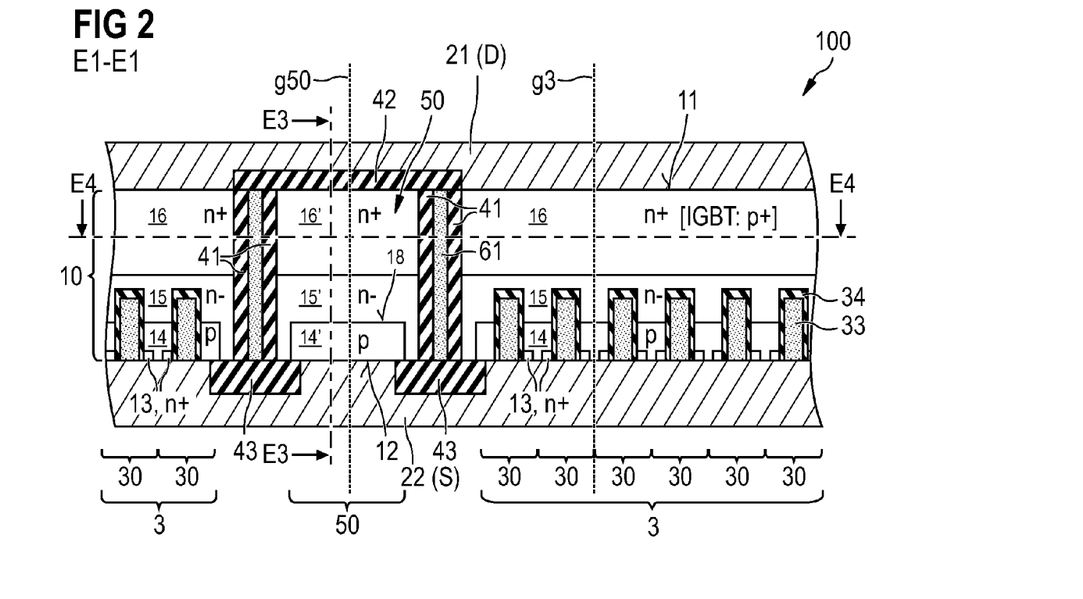
FIG. 2 is a vertical cross-sectional view through a section of the power transistor of FIG. 1 in a cross-sectional plane E1-E1.

The internal structure of the power transistor 100 of FIG. 1 is illustrated in the cross-sectional views of FIGS. 2 to 5. FIG. 2 is a vertical cross-sectional view through a section of the power transistor 100 of FIG. 1 in a cross-sectional plane E1-E1 (see FIGS. 1, 4 and 5). The top side 11 of the semiconductor body 10 is arranged, in a vertical direction v, distant from a bottom side 12. The vertical direction v may run perpendicular to the bottom side 12.

As can be seen from FIG. 2, the power transistor 100 is a vertical transistor having a plurality of transistor cells 30 arranged in one or more active transistor cell regions 3. For instance, the individual transistor cells 30 may be realized as strip cells running parallel to one another. However, the individual transistor cells 30 may also have any other cell structure like rectangular, square, hexagonal or arbitrarily polygonal.

A drift zone 15 of a first conduction type (here: 'n') and a body zone 14 of a second conduction type (here: 'p') which is complementary to the first conduction type are formed in the semiconductor body 10. The body zone 14, which is arranged between the drift zone 15 and the bottom side 12, contacts a source (S) contact terminal 22 arranged on the bottom side 12. Further, a drain zone 16 formed in the semiconductor body 10 is arranged between the top side 11 and the drift zone 15 and directly abuts the drift zone 15. The drain zone 16 is of the first conduction type (here: 'n') if the power transistor 100 is a MOSFET (metal oxide semiconductor field effect transistor) or of the second conduction type (here: 'p') if the power transistor 100 is an IGBT (insulated gate bipolar transistor). In both cases, the drain zone 16 has a dopant concentration that is higher than a dopant concentration of the drift zone 15. In the sense of the present invention, 'dopant concentration' relates to the concentration of electrically active dopants, that is, to dopants causing either an n-conductivity or a p-conductivity after being introduced into the semiconductor body 10.

Further, each of the transistor cells 30 has a one or more heavily doped source zones 13 of the first conduction type (here: 'n').

A doping concentration of the drift zone 15 lies for example in the range of $10^{15}$ cm$^{-3}$ to $10^{17}$ cm$^{-3}$ (1E15 cm$^{-3}$ to 1E17 cm$^{-3}$), a doping concentration of the source zone 13 in the range of $10^{19}$ cm$^{-3}$ to $10^{20}$ cm$^{-3}$ (1E19 cm$^{-3}$ to 1E20 cm$^{-3}$) and a doping concentration of the drain zone 16 in the range of $5*10^{17}$ cm$^{-3}$ to $10^{21}$ cm$^{-3}$ (5E17 cm$^{-3}$ to 1E21 cm$^{-3}$) for a MOSFET and for example in the range of $10^{17}$ cm$^{-3}$ to $10^{19}$ cm$^{-3}$ (1E17 cm$^{-3}$ to 1E19 cm$^{-3}$) for an IGBT.

For controlling an electric current between the source contact terminal 22 and the drain contact terminal 21, each of the transistor cells 30 has a gate electrode 33, e.g. consisting of or including a doped polycrystalline semiconductor material like polycrystalline silicon. A gate dielectric 34, e.g. a semiconductor oxide, is arranged adjacent the gate electrodes 33 in order to dielectrically insulate the gate electrodes 33 from the drift zone 15 and the body zone 14.

The transistor cells 30 are electrically connected in parallel to one another. That is, for each of the transistor cells 30, the source zones 13 are electrically connected to the common source contact terminal 22, the drain zone 16 is electrically connected to the common drain contact terminal 21, and the gate electrodes 33 are electrically connected to a common gate contact terminal 23. In other words, all transistor cells 30 share a common drain contact terminal 21, a common source contact terminal 22, and a common gate contact terminal 23.

In addition, the semiconductor body 10 has a temperature sensor diode 50 with an n-doped cathode zone 15', 16' and a p-doped anode zone 14'. The anode zone 14' is electrically connected to the source contact terminal 22 and the cathode zone 15', 16' is electrically connected to the temperature sense contact terminal 24 (see FIG. 1). Further the anode zone 14' is completely covered by the drain contact terminal 21.

A pn-junction 18 is formed between the n-doped cathode zone 15', 16' and the p-doped anode zone 14'. The pn-junction 18 may be used for sensing a temperature of the power transistor 100. In order to determine the temperature of the temperature sensor diode 50, the reverse current through the pn-junction 18 can be measured and evaluated if the pn-junction 18 is operated reverse-biased. This makes use of the fact that the reverse current of such a reverse-biased pn-junction 18 raises exponentially with temperature. Alternatively, it is also possible to impress an electric current into the pn-junction 18 when the pn-junction 18 is forward-biased, and to measure and evaluate the forward voltage across the pn-junction 18. This makes use of the fact that the forward voltage of such a reverse-biased pn-junction 18 is also temperature dependent.

In order to avoid an electric interference between the temperature sensor diode 50 and the active transistor cell region(s) 3, a dielectric 41 separates the temperature sensor diode 50 from the body zone(s) 14, the drift zone 15 and the drain zone 16 of the active transistor cell region(s) 3. The dielectric 41 is double-walled with a polycrystalline semiconductor material 61 in between so as to reduce mechanical stress. However, the polycrystalline semiconductor material 61 is optional and can be replaced by a dielectric, for instance the dielectric 41. That is, the dielectric 41 may also occupy the area of the polycrystalline semiconductor material 61.

Further, a dielectric 42 is provided above the temperature sensor diode 50. The dielectric 42 is deposited on the top side 11 of the semiconductor body 10 prior to the production of the drain contact terminal 21 in order to avoid the drain contact terminal 21 causing a short circuit between the temperature sensor diode 50 and the drain zone 16.

The temperature sensor diode 50 may be produced in parallel with the body zone 14, the drift zone 15 and the drain zone 16 of the active transistor cell region(s) 3. For instance, the drain zone 16 may be provided as a highly n-doped (n+) semiconductor substrate on which a weakly n-doped (n−) epitaxial layer is produced. Subsequently, p-doped regions extending into the epitaxial layer from that side facing away from the highly n-doped (n+) semiconductor substrate are produced in a structured manner by conventional techniques like masked diffusion or masked implantation, etc. Then, the remaining parts of the power transistor 100 are produced. In the completed power transistor 100, the drain zone 16 and a sub-zone 16' of the cathode zone are remainders of the highly n-doped semiconductor substrate, the drift zone 15. A further sub-zone 15' of the cathode zone is a remainder of the weakly n-doped epitaxial layer, and the body zone 14 and the anode zone 14' are remainders of the p-doped regions. However, if the power transistor 100 to be produced is an IGBT, instead of a highly n-doped (n+) semiconductor substrate a highly p-doped (p+) semiconductor substrate may be used with the same subsequent steps as described above.

Hence, using such a production method, the process of the production of the temperature sensor diode 50 may easily be integrated in the process of the production of the power transistor 100. A further consequence is that the drain zone 16 and the sub-zone 16' can have, in the vertical direction v, the same doping profile. Accordingly, the drift zone 15 and the further sub-zone 15' can have, in the vertical direction v, the same doping profile. In the same way, the body zone 14 and the anode zone 14' can have, in the vertical direction v, the same doping profile.

The illustrated structure of the transistor cells 30 is exemplary and the principle of the invention may be realized with any other cell structure of the transistor cells 30.

Different from the illustrated example, it is also possible to provide a transistor cell structure having the same structure as the transistor cells 30 within the region enclosed by the dielectrics 41, 42, 43 and the source contact terminal 22, but without electrically connecting the 'source zones' of that structure to source contact terminal 22, and optionally without electrically connecting the 'gate electrodes' of that structure to gate contact terminal 23. In doing so, a process for the production of a conventional source-down/common source transistor can simply be modified by separating at least one of the conventional transistor cells from the other transistor cells by dielectrics 41, 42, 43 in order to use at least one of the separated transistor cells as a temperature sensor diode 50, and to disable the unneeded one of the separated transistor cells, for instance using an additional dielectric arranged between the cells to be disabled and the source contact terminal 22. However, the 'body zone(s)' of the separated transistor cells serving as the anode zone 14' of the temperature sensor diode 50 are electrically connected to the source contact terminal 22 as described above.

Figure 3:
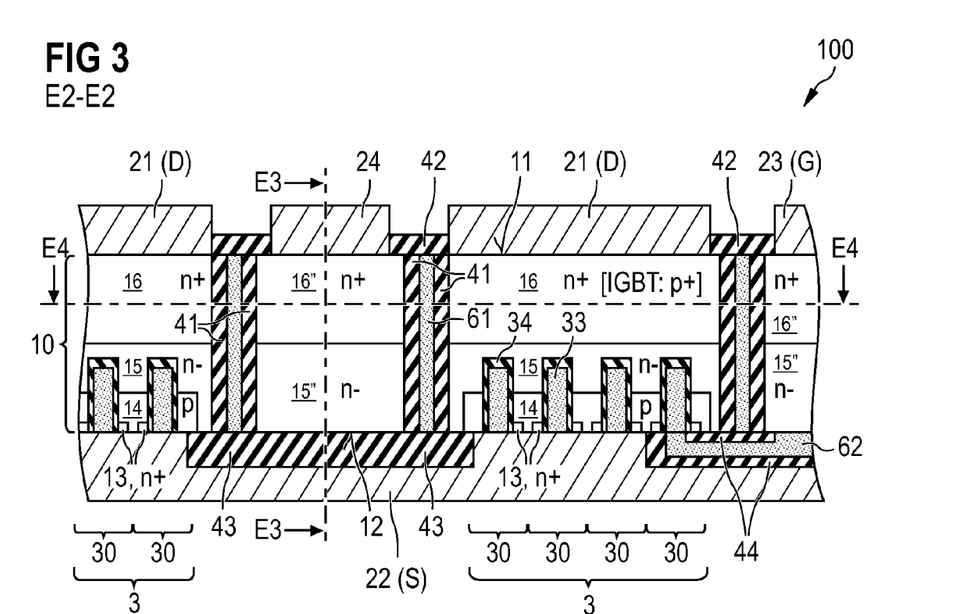
FIG. 3 is a vertical cross-sectional view through a section of the power transistor of FIG. 1 in a cross-sectional plane E2-E2.
Figure 4:
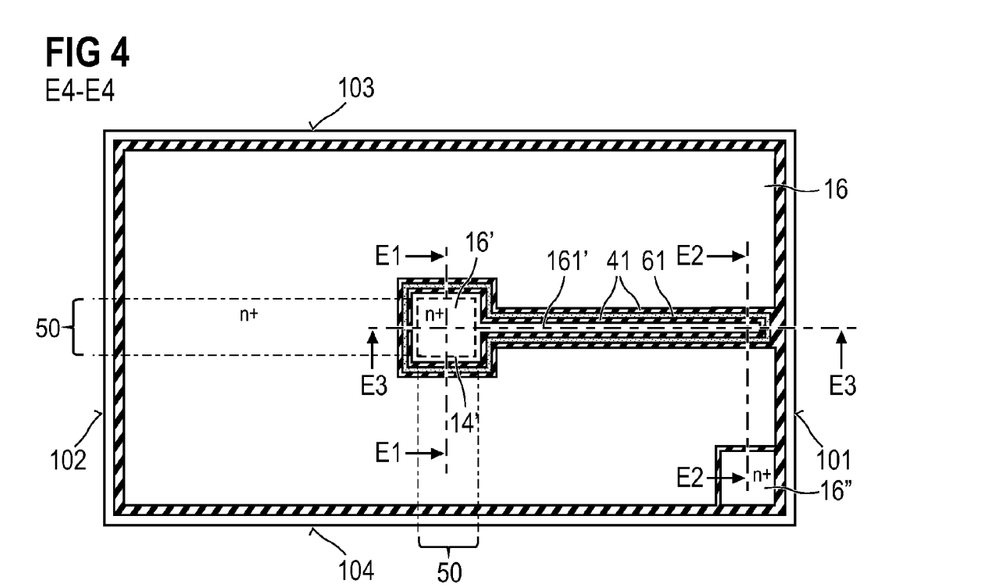
FIG. 4 is a horizontal cross-sectional view of the power transistor of FIG. 1 in a cross-sectional plane E4-E4.
Figure 5:
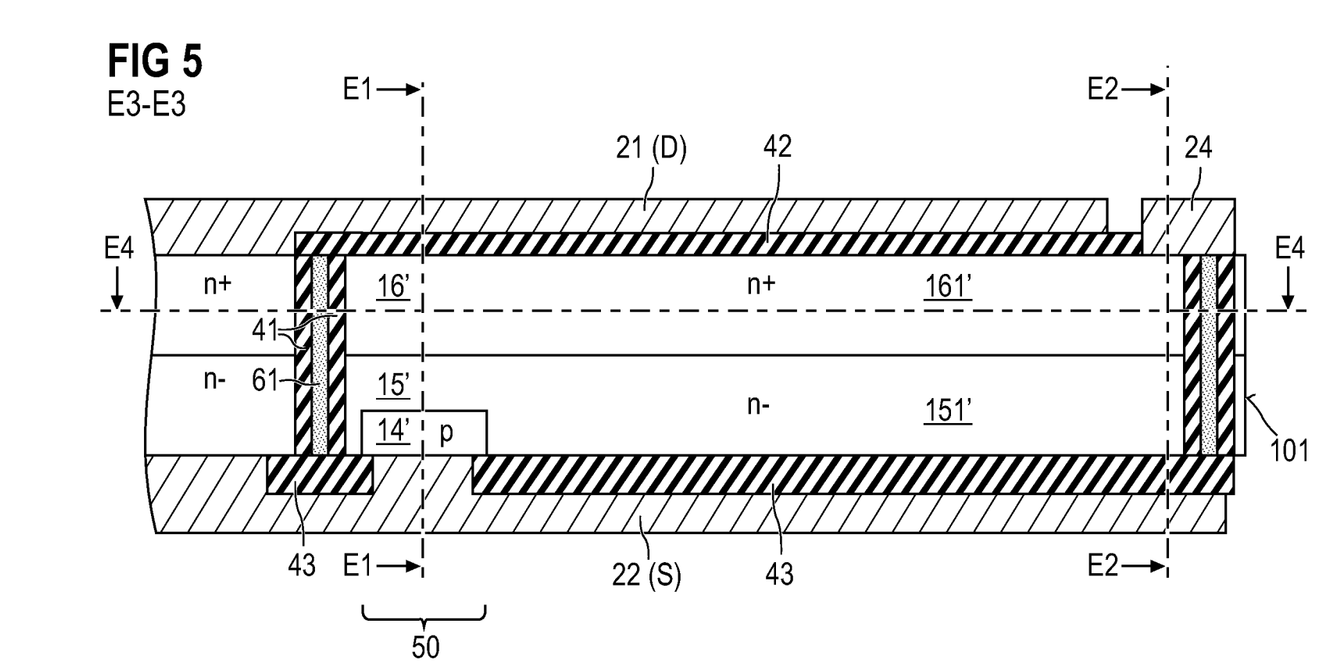
FIG. 5 is a vertical cross-sectional view of the power transistor of FIG. 1 in a cross-sectional plane E3-E3.

FIG. 3 is a vertical cross-sectional view of a section of the power transistor 100 of FIG. 1 in a cross-sectional plane E2-E2 (see FIGS. 1, 4 and 5) that intersects both the gate contact terminal 23 and the temperature sense contact terminal 24. FIG. 4 is a horizontal cross-sectional view of the power transistor 100 of FIG. 1 in a cross-sectional plane E4-E4 (see FIGS. 2, 3 and 5) that intersects in particular the drain zone 16 and the sub-zone 16' parallel to the bottom side 12. FIG. 5 is a vertical cross-sectional view of a section of the power transistor 100 of FIG. 1 in a cross-sectional plane E3-E3 (see FIGS. 1 to 4) that intersects both the temperature sensor diode 50 and the temperature sense contact terminal 24.

As can be seen when comparing FIGS. 2 to 5, the anode zone 14' is only arranged in the central region of the semiconductor body 10 where usually the maximum temperature of the power transistor 100 occurs. In FIG. 4, the location of the anode zone 14' is indicated by a broken line as it is hidden out of view underneath the sub-zones 15' and 16'. By arranging the anode zone 14' only in the central region of the semiconductor body 10, also the pn-junction 18 for sensing the temperature is arranged only in the central region of the semiconductor body 10. Hence, the measured temperature corresponds in good approximation to the maximum temperature that occurs within the power transistor 100.

As is illustrated in FIGS. 4 and 5, the sub-zone 16' (and optionally also the hidden sub-zone 15') has a longish section 161' that electrically interconnects the cathode zone 15', 16' of the temperature sensor diode 50 and the temperature sense contact terminal 24. Further, referring to FIG. 3 again, an electrically conductive layer 62, e.g. of doped polycrystalline semiconductor material, a weakly doped semiconductor zone 15" and a heavily doped semiconductor zone 16" both of the first conduction type (here: 'n') interconnect the gate electrodes 33 and the gate contact terminal 23. So as to avoid short circuits between the electrically conductive layer 62 and both the source electrode pad 22 and that section of the semiconductor body 10 arranged in the active transistor cell region(s) 3, dielectrics 44 are provided between the electrically conductive layer 62 and the bottom side 12 and between the electrically conductive layer 62 and the source electrode pad 22, respectively.

In FIG. 3 only one of the gate electrodes 33 appears to be connected to the gate contact terminal 23. However, in fact the gate electrodes 33 of all transistor cells 30 are interconnected by electrically conductive connection lines that are hidden in FIG. 3.

The contact terminals 21, 22, 23, 24 serve to electrically connect the power transistor 100 to external devices and/or circuits like a circuit board, a power supply, a load, etc. Hence, the terminals 21, 22, 23, 24 are required to have a low electric resistance which can be achieved by forming the terminals 21, 22, 23, 24 as layers consisting of or including metal, e.g. aluminum, copper, tungsten, titanium, molybdenum, alloys with at least one of those metals, and/or consisting of or including doped polycrystalline semiconductor material like silicon, etc.

Figure 6:
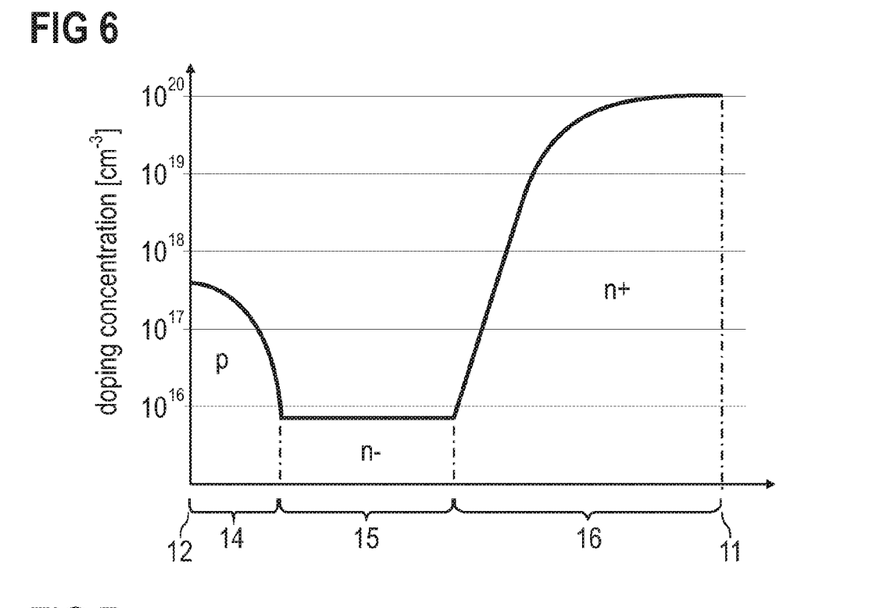
FIG. 6 is a diagram that illustrates a doping profile of the power transistor of FIG. 1.

Referring now to FIG. 6, there is illustrated a doping profile of the power transistor 100 of FIGS. 1 to 5. This embodiment illustrates that the temperature sensor diode 50 and the transistor cells 30 may optionally have the same uniform doping profile which is advantageous for the production of the power transistor 100 because the temperature sensor diode 50 and the transistor cells 30 can share common production processes. Such a uniform doping profile as exemplarily illustrated in FIG. 6 may identically appear along two parallel straight lines g3 and g50 both running perpendicular to the bottom side 12, wherein the straight line g50 intersects the temperature sensor diode 50 including the anode zone 14' and the cathode zone 15', 16'. The straight line g3 intersects a transistor cell 30 including the body zone 14, the drift zone 15 and the drain zone 16.

Figure 7:
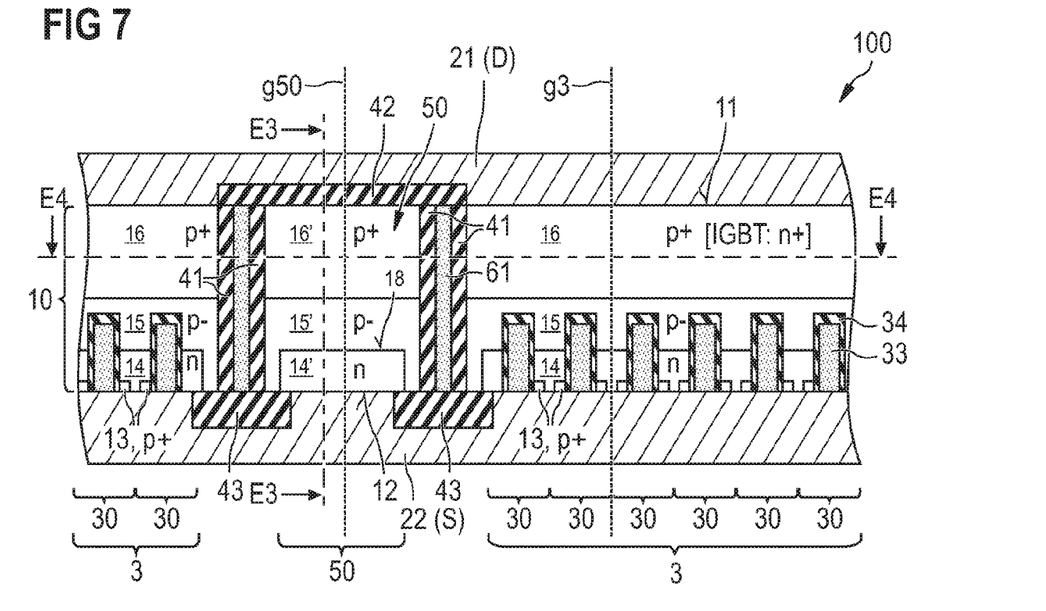
FIG. 7 is a vertical cross-sectional view through a section of a power transistor that corresponds to the power transistor of FIG. 1 with the difference being that the conduction types of the semiconductor zones are exchanged.

In the above drawings, a power transistor 100 according to the present invention has been explained by way of example for n-channel transistors, that is, for transistors in which the first conduction type is 'n' and the second conduction type is 'p'. However, the same principle may also be realized in p-channel transistors, that is, in transistors in which the first conduction type is 'p' and the second conduction type is 'n'. This is illustrated in FIG. 7 for a p-channel transistor 100 that has the same structure as the n-channel transistor 100 explained with reference to FIGS. 1 to 6, except the types of conductivity are exchanged.

Figure 8:
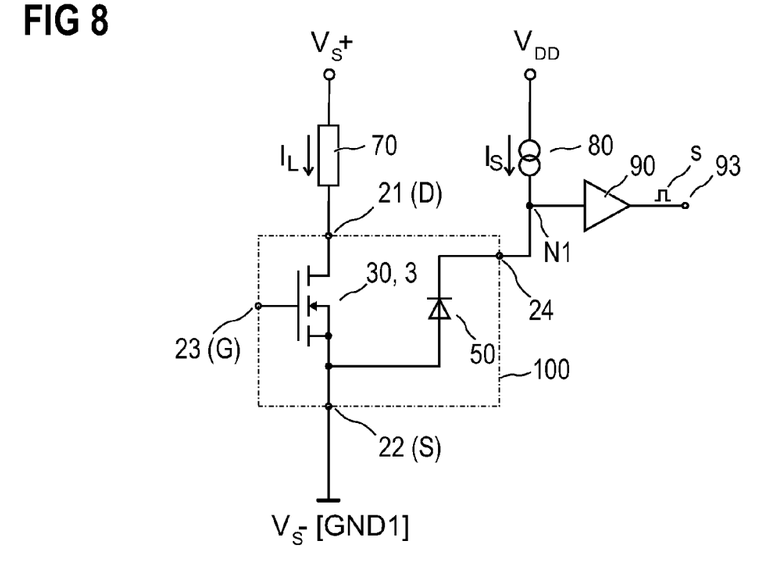
FIG. 8 is a circuit diagram of a first circuit for determining the temperature at the pn-junction of the temperature sensor diode of the power transistor of FIG. 1 dependent on the voltage drop over a reverse-biased pn-junction.

Referring now to FIG. 8 there is illustrated a first embodiment for determining the temperature state of the temperature sensor diode 50 of a power transistor 100 as has been explained above. According to the first embodiment, the pn-junction 18 of the temperature sensor diode 50 is reverse-biased during the period, in which the temperature state of the temperature sensor diode 50 is determined. Thereby, the power transistor 100 is an n-channel transistor and operated in low side configuration.

The source contact terminal 22 is directly connected to a ground potential GND1 or to a negative supply potential $V_S-$ which may be identical to GND1. A load 70 is connected between a first positive supply potential ($V_S+$) and the drain contact terminal 21. That is, the load 70 is connected in series with a load path of the transistor 100, said load path being formed between the source contact terminal 22 and the drain contact terminal 21. The electrical conductivity of the load path may be controlled by applying a suitable electric potential to the gate contact terminal 23.

Further, a current source 80, e. g. a constant current source, is connected between a second positive supply potential ($V_{DD}$) and the temperature sense contact terminal 24. An input of a temperature evaluation unit 90, e. g. a comparator, a Schmitt-trigger, an analog-to-digital converter, a threshold switch, an inverter, etc., is connected to a circuit node N1 between the current source 80 and the temperature sense contact terminal 24.

Depending on the current through the current source 80 and the temperature of the temperature sensor diode 50, an electric potential which is a measure for the temperature of the temperature sensor diode 50 occurs at the input of the temperature evaluation unit 90 and can be further evaluated by the temperature evaluation unit 90. Depending on the type of temperature evaluation unit 90, an output 93 of the temperature evaluation unit 90 may either provide an analog or digital control signal 's' (e.g. a voltage or a current signal) that corresponds to the temperature of the temperature sensor diode 50, or a digital control signal 's' indicating whether or not the temperature of the temperature sensor diode 50 exceeds a pre-defined value.

In that circuit, the pn-junction 18 of the temperature sensor diode 50 is reverse-biased and a temperature dependent reverse current flows through the pn-junction 18. If the temperature of the pn-junction 18 increases, the reverse current will also increase and, at some time, exceed the current Is provided by the current source 80, and the electric potential at the circuit node N1 will drop from about $V_{DD}$ towards GND1 and/or $V_S-$ potential. The temperature measurement may take place independently from the common switching state of the transistor cells 30, that is, a temperature measurement may be carried out as well during a period in which the transistor cells 30 are switched on (conductive state) as during a period in which the transistor cells 30 are switched off (blocking state).

Figure 9:
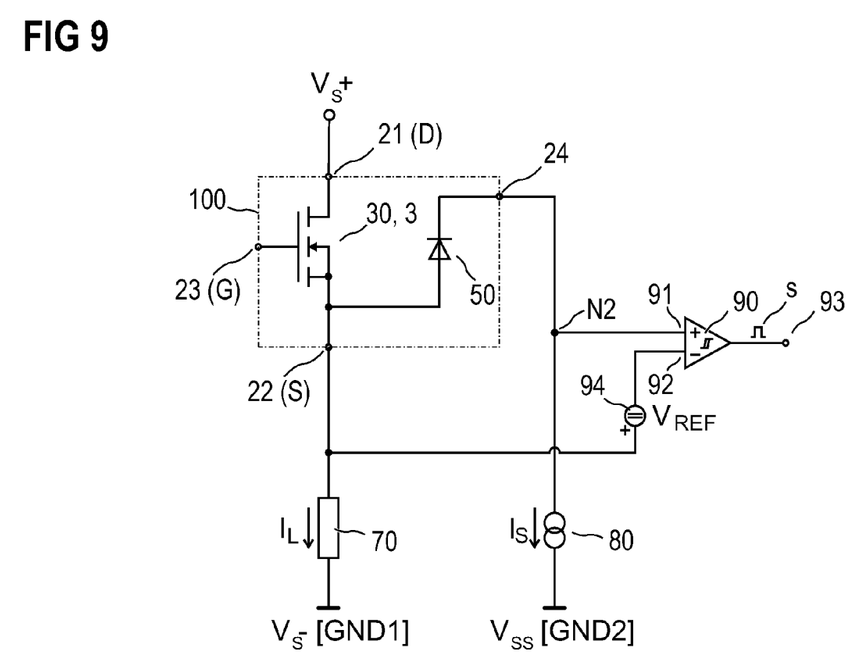
FIG. 9 is a circuit diagram of a second circuit for determining the temperature at the pn-junction of the temperature sensor diode of the power transistor of FIG. 1 dependent on the voltage drop over a forward-biased pn-junction.

Referring now to FIG. 9 there is illustrated a second embodiment for determining the temperature state of the temperature sensor diode 50 of a power transistor 100 as has been explained above with reference to FIGS. 1 to 6. According to the second embodiment, the pn-junction 18 of the temperature sensor diode 50 is forward-biased during the period, in which the temperature state of the temperature sensor diode 50 is determined. Again, the power transistor 100 is an n-channel transistor but this time operated in high side configuration.

The drain contact terminal 21 is directly connected to a positive supply potential ($V_S$+). A load 70 is connected between the source contact terminal 22 and a ground potential GND1 or to a negative supply potential $V_S$− which may be identical to GND1. That is, the load 70 is connected in series with the load path of the transistor 100.

Further, a current source 80, e. g. a constant current source, is connected between the temperature sense contact terminal 24 and a further ground potential GND2 or a further negative supply potential $V_{SS}$ which may be identical to GND2. A first input 91 of a temperature evaluation unit 90, e.g. a comparator, a Schmitt-trigger, an analog-to-digital converter, a threshold switch, an inverter, etc., is connected between the source contact terminal 22 and a circuit node N2 between the current source 80 and the temperature sense contact terminal 24. A reference voltage source 94 providing a reference Voltage $V_{REF}$ is connected between a second input 92 of the temperature evaluation unit 90 and the source contact terminal 22.

In that circuit, the pn-junction 18 of the temperature sensor diode 50 is forward-biased and a temperature dependent forward current flows through the pn-junction 18. In this configuration, the forward voltage across the temperature sensor diode 50, and, associated therewith, the absolute value of the voltage between the source contact terminal 22 and the circuit node N2, drops with increasing temperature of the pn-junction 18.

The difference between the electric potentials at the inputs 91 and 92 of the temperature evaluation unit 90 is a measure for the temperature of the temperature sensor diode 50. Depending on the type of temperature evaluation unit 90, an output 93 of the temperature evaluation unit 90 may either provide an analog or digital control signal 's' (e.g. a voltage or a current signal) that corresponds to the temperature of the temperature sensor diode 50, or a digital control signal 's' indicating whether or not the temperature of the temperature sensor diode 50 exceeds a pre-defined value.

Figure 10:
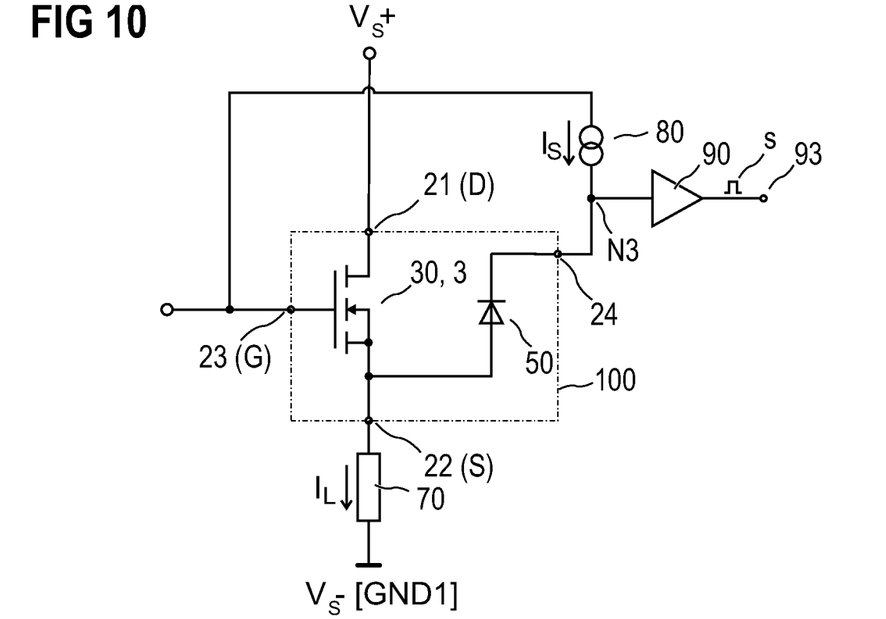
FIG. 10 is a circuit diagram of a third circuit for determining the temperature at the pn-junction of the temperature sensor diode of the power transistor of FIG. 1 dependent on the voltage drop over a reverse-biased pn-junction.

Referring now to FIG. 10 there is illustrated a third embodiment for determining the temperature state of the temperature sensor diode 50 of a power transistor 100 as has been explained above with reference to FIGS. 1 to 6. According to the third embodiment, the pn-junction 18 of the temperature sensor diode 50 is reverse-biased during the period, in which the temperature state of the temperature sensor diode 50 is determined. Again, the power transistor 100 is an n-channel transistor operated in high side configuration.

The drain contact terminal 21 is directly connected to a positive supply potential ($V_S$+). A load 70 is connected between the source contact terminal 22 and a ground potential GND 1 or a negative supply potential $V_S$− which may be identical to GND1. That is, the load 70 is connected in series with a load path of the transistor 100.

Further, a current source 80, e. g. a constant current source, is connected between the gate contact terminal 23 and the temperature sense contact terminal 24. As in that configuration the temperature sensor diode 50 is reverse biased, a control voltage applied to the gate contact terminal 23 is not substantially affected by the current source 80. An input of a temperature evaluation unit 90, e. g. a comparator, a Schmitt-trigger, an analog-to-digital converter, a threshold switch, an inverter, etc., is connected to a circuit node N3 between the current source 80 and the temperature sense contact terminal 24.

In that circuit, the pn-junction 18 of the temperature sensor diode 50 is reverse-biased and a temperature dependent reverse current flows through the pn-junction 18. If the temperature of the pn-junction 18 increases, the reverse current will also increase and change the electric potential that occurs at the circuit node N3 which can be detected and evaluated by the temperature evaluation unit 90.

The electric potential at the input of the temperature evaluation unit 90 is a measure for the temperature of the temperature sensor diode 50. Depending on the type of temperature evaluation unit 90, an output 93 of the temperature evaluation unit 90 may either provide an analog or digital control signal 's' (e.g. a voltage or a current signal) that corresponds to the temperature of the temperature sensor diode 50, or a digital control signal 's' indicating whether or not the temperature of the temperature sensor diode 50 exceeds a pre-defined value.

As further illustrated in FIG. 11, the principles of the circuits explained with reference to FIGS. 9 and 10 may be combined with one another sharing the same power transistor 100 such that the temperature at the pn-junction 18 can be measured either using a first sub-circuit that measures the temperature with the pn-junction 18 forward-biased, or using a second sub-circuit that measures the temperature with the pn-junction 18 reverse-biased. In both cases, the power transistor 100 may be an n-channel transistor operated in high side configuration. Measuring the temperature using the first sub-circuit may take place even if the load path of the power transistor 100 is switched on (conducting state), but also if the load path of the power transistor 100 is switched off (blocking state). Measuring the temperature using the second sub-circuit may take place if the load path of the power transistor 100 is switched off (blocking state).

For determining the temperature state using the first sub-circuit, the temperature sense contact terminal 24 is electrically connectible via a first switch S1 to the first sub-circuit. Accordingly, for determining the temperature state using the second sub-circuit, the temperature sense contact terminal 24 is electrically connectible via a second switch S2 to the second sub-circuit. The first and second switches S1 and S2 are intended to represent arbitrary switches like, for instance, transistors.

At the same point of time, the switching states of the first and second switches S1 and S2 may be as follows: both S1 and S2 are open (blocking state); or S1 is closed (conductive state) and S2 is open (blocking state); or S1 is open (conductive state) and S2 is closed (blocking state). That is, at each point of time at maximum one of the switches S1 and S2 is closed.

Figure 11:
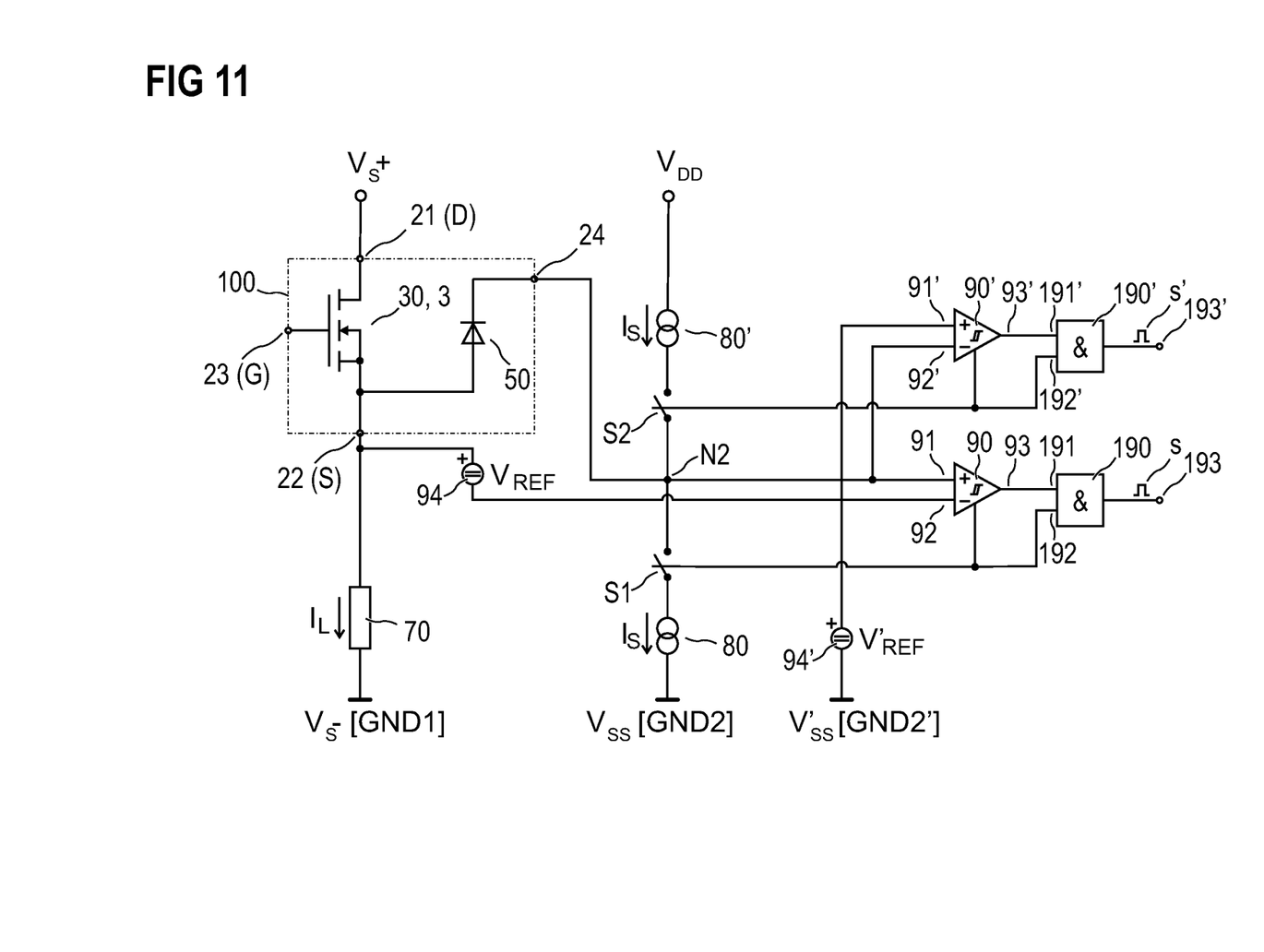
FIG. 11 is a circuit diagram of a fourth circuit for determining the temperature at the pn-junction of the temperature sensor diode of the power transistor of FIG. 1 dependent on the voltage drop over a reverse-biased pn-junction.

In the example of FIG. 11, the drain contact terminal 21 is directly connected to a positive supply potential $V_S$+. A load 70 is connected between the source contact terminal 22 and a ground potential GND1 or a negative supply potential $V_{S}-$ which may be identical to GND1. That is, the load 70 is connected in series with the load path of the transistor 100.

The first sub-circuit comprises a current source 80, a reference voltage source 94, and a temperature evaluation unit 90. Accordingly, the second sub-circuit comprises a second current source 80', a second reference voltage source 94', and a second temperature evaluation unit 90'. The first current source 80 and the second current source 80' are electrically connected in series between the first switch S1 and the second switch S2.

In the first sub-circuit, the current source 80, e.g. a constant current source, is connected between the first switch S1 and a further ground potential GND2 or negative supply potential $V_{SS}$ which may be identical to GND2. A first input 91 of the temperature evaluation unit 90, e.g. a comparator, a Schmitt-trigger, an analog-to-digital converter, a threshold switch, an inverter, etc., is, at a circuit node N2, electrically connected to the temperature sense contact terminal 24. The current source 80 is electrically connected between the first switch SW1 and GND2/$V_{SS}$. If the first switch SW1 is closed (conductive state of SW1), the current source 80 is electrically connected between the circuit node N2 and GND2/$V_{SS}$ and provides an electric current $I_S$. Depending on that electric current $I_S$ and the temperature of the temperature sensor diode 50, an electric potential occurs at the first input 91 of the temperature evaluation unit 90.

Further, a reference voltage source 94 providing a reference Voltage $V_{REF}$ is connected between a second input 92 of the temperature evaluation unit 90 and the source contact terminal 22 so that the second input 92 has a well-defined electrical potential relative to the source contact terminal 22. As a result, an electric potential difference between the electric potentials at the inputs 91 and 92 of the temperature evaluation unit 90 is a measure for the temperature of the temperature sensor diode 50 and can be evaluated by the temperature evaluation unit 90.

Depending on the type of temperature evaluation unit 90, an output 93 of the temperature evaluation unit 90 may either provide an analog or digital control signal 's' (e.g. a voltage or a current signal) that corresponds to the temperature of the temperature sensor diode 50, or a digital control signal 's' indicating whether or not the temperature of the temperature sensor diode 50 exceeds a pre-defined value.

In that first sub-circuit, the pn-junction 18 of the temperature sensor diode 50 is forward-biased and a temperature dependent forward current flows through the pn-junction 18. In this configuration, the forward voltage across the temperature sensor diode 50, and, associated therewith, the absolute value of the voltage between the source contact terminal 22 and the circuit node N2, drops with increasing temperature of the pn-junction 18.

In the second sub-circuit, the current source 80', e.g. a constant current source, is connected between a second positive supply potential $V_{DD}$ and the second switch S2. The current source 80' and the second switch S2 are connected in series between the second positive supply potential $V_{DD}$ and the temperature sense contact terminal 24. If the second switch S2 is closed, the current source 80' is connected between the second positive supply potential $V_{DD}$ and the temperature sense contact terminal 24.

A reference voltage source 94' providing a reference Voltage $V'_{REF}$ is connected between a first input 91' of a temperature evaluation unit 90', e.g. a comparator, a Schmitt-trigger, an analog-to-digital converter, a threshold switch, an inverter, etc., and still a further ground potential GND2' or negative supply potential $V'_{SS}$ which may be identical to GND2'. A second input 92' of the temperature evaluation unit 90' is connected to the temperature sense contact terminal 24. Due to the reference voltage source 94', the first input 91' of the temperature evaluation unit 90' has a well-defined electrical potential relative to $V'_{SS}$/GND2'.

If in that second sub-circuit the second switch S2 is closed, an electric current $I'_S$ through the current source 80' establishes, and, depending on that electric current $I'_S$ and the temperature of the temperature sensor diode 50, an electric potential difference which is a measure for the temperature of the temperature sensor diode 50 occurs between the inputs 91' and 92' of the temperature evaluation unit 90'. The electric potential difference can be further evaluated by the temperature evaluation unit 90'. Depending on the type of temperature evaluation unit 90', an output 93' of the temperature evaluation unit 90' may either provide an analog or digital control signal s' (e.g. a voltage or a current signal) that corresponds to the temperature of the temperature sensor diode 50, or a digital control signal s' indicating whether or not the temperature of the temperature sensor diode 50 exceeds a pre-defined value.

Using the second sub-circuit, the pn-junction 18 of the temperature sensor diode 50 is reverse-biased during the period, in which the temperature state of the temperature sensor diode 50 is determined.

Optionally, the first sub-circuit may comprise a logic circuit 190 having a first input 191, a second input 192, and an output 193. The first input 191 is connected to the output 93 in order to receive an output control signal s provided by the temperature evaluation unit 90. The received output control signal 's' or a corresponding control signal 's' is provided at the output 193 of the logic circuit 190 if an enable signal EN is applied to the second input 192 of the logic circuit 190. The enable signal EN may be provided to the second input 192 if the first switch S1 is closed.

Also optionally, the second sub-circuit may comprise a further logic circuit 190' having a first input 191', a second input 192', and an output 193'. The first input 191' is connected to the output 93' in order to receive an output control signal s' provided by the temperature evaluation unit 90'. The received output control signal s' or a corresponding control signal s' is provided at the output 193' of the further logic circuit 190' if a further enable signal EN' is applied to the second input 192' of the further logic circuit 190'. The further enable signal EN' may be provided to the second input 192' if the first switch S1 is closed.

In the illustrated embodiment, the logic circuits 190, 190' are designed as logic AND gates. However, any other logic circuits providing the same functionality may be used as well.

Figure 12:
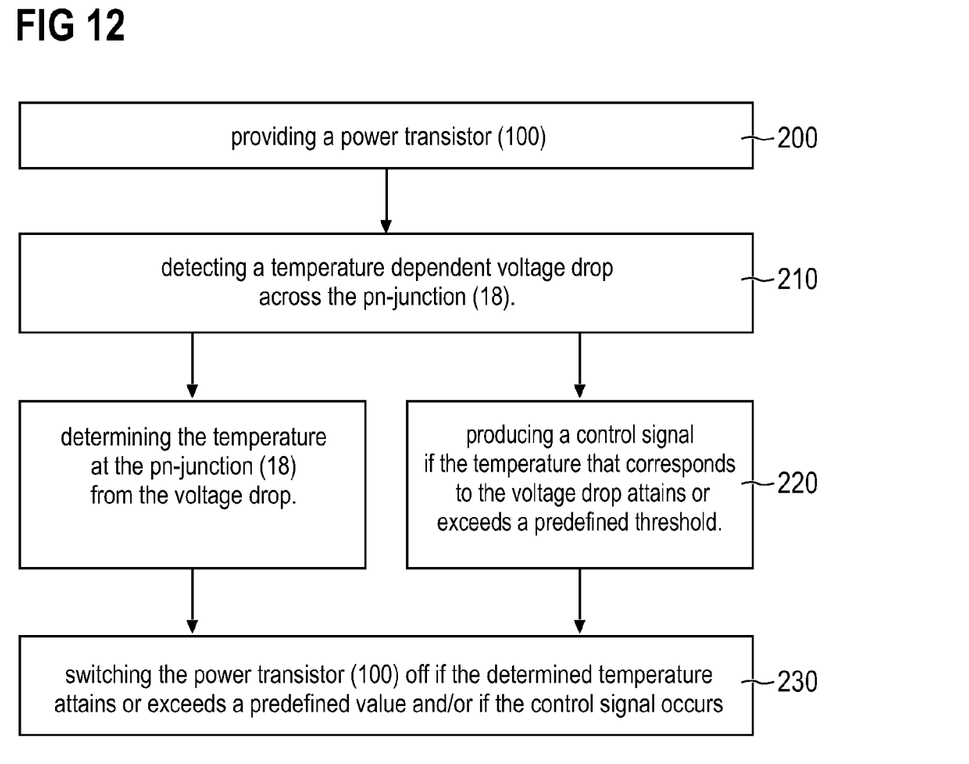
FIG. 12 is a diagram describing a method for operating the power transistor of FIG. 1.

In a power transistor as previously explained with reference to the above embodiments, the voltage drop over the forward- or reverse-biased pn-junction 18 may be used to determine the temperature at the pn-junction 18, and/or to trigger an operation, for instance switching the load path of the power transistor 100 off if the temperature that corresponds to the voltage drop attains or exceeds a predefined value (overheat protection). This is illustrated in FIG. 12 by way of a diagram explaining a method for operating the power transistor 100 of FIG. 1. According to a first step 200, a power transistor 100 is provided. The power transistor 100 may have any of the above-explained structures. According to a subsequent step 210, a temperature dependent voltage drop across the pn-junction 18 of the temperature sensor diode 50 of that transistor 100 is detected. Based on that voltage drop, the corresponding temperature at the pn-junction 18 may be determined (see step 220). Alternatively or in addition, an analog and/or digital control signal may be produced if the voltage drop attains or exceeds a predefined threshold. In an optional further step 230, the power transistor is switched off if the determined temperature attains or exceeds a predefined value and/or if the control signal occurs. In that sense, 'switched off' means the power transistor's load path between the source contact terminal 22 and the drain contact terminal 21 is switched to its high-ohmic (blocking) state by applying an appropriate electrical control potential to the gate contact terminal 23.

Of course, the temperature at the pn-junction 18 may be determined also for purposes other than for overheat protection and other than for switching the load path of the power transistor off. For instance, for displaying and/or recording the temperature.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A power transistor, comprising:
    a semiconductor body comprising:
        a bottom side and a top side spaced distant from the bottom side in a vertical direction;
        a plurality of transistor cells;
        a source zone of a first conduction type;
        a body zone of a second conduction type complementary to the first conduction type;
        a drift zone of the first conduction type;
        a drain zone;
        a temperature sensor diode comprising a pn-junction formed between an n-doped cathode zone and a p-doped anode zone;
        a first dielectric section extending from the bottom side to the top side, the first dielectric section being arranged between the cathode zone on one side and both the drift zone and the drain zone on another side;
    a drain contact terminal arranged on the top side;
    a source contact terminal arranged on the bottom side;
    a gate contact terminal; and
    a temperature sense contact terminal arranged on the top side and dielectrically insulated from the drain contact terminal;
    wherein either
        (I) the first conduction type is 'n' and the second conduction type is 'p', the anode zone is electrically connected to the source contact terminal, and the cathode zone is electrically connected to the temperature sense contact terminal; or
        (II) the first conduction type is 'p' and the second conduction type is 'n', the cathode zone is electrically connected to the source contact terminal, and the anode zone is electrically connected to the temperature sense contact terminal.

2. The power transistor as claimed in claim 1, wherein a distance between the pn-junction and the bottom side is smaller than a distance between the pn-junction and the top side.

3. The power transistor as claimed in claim 1, wherein the body zone comprises, in the vertical direction, a first doping profile, and wherein the anode zone comprises, in the vertical direction, a second doping profile identical to the first doping profile.

4. The power transistor as claimed in claim 1, wherein the drift zone comprises, in the vertical direction, a first doping profile, and wherein a first sub-zone of the cathode zone comprises, in the vertical direction, a second doping profile identical to the first doping profile.

5. The power transistor as claimed in claim 1, wherein the drain zone comprises, in the vertical direction, a first doping profile, and wherein a second sub-zone of the cathode zone comprises, in the vertical direction, a second doping profile identical to the first doping profile.

6. The power transistor as claimed in claim 1, wherein the drain contact terminal is a continuous connected layer without through holes.

7. The power transistor as claimed in claim 1, wherein the anode zone is completely overlaid by the drain contact terminal.

8. The power transistor as claimed in claim 1, wherein the gate contact terminal is arranged on the top side.

9. The power transistor as claimed in claim 1, wherein the temperature sensor diode is surrounded by a u-shaped dielectric well that completely insulates the temperature sensor diode from the source, body, drain and drift zones, the u-shaped dielectric well comprising the first dielectric section, a second dielectric section disposed on the top side, and a third dielectric section disposed on the bottom side between the first dielectric section and the source contact terminal.

10. A power transistor circuit, comprising:
    (a) a power transistor comprising:
        a semiconductor body comprising:
            a bottom side and a top side spaced distant from the bottom side in a vertical direction;
            a plurality of transistor cells;
            a source zone of a first conduction type;
            a body zone of a second conduction type complementary to the first conduction type;
            a drift zone of the first conduction type;
            a drain zone;
            a temperature sensor diode comprising a pn-junction formed between an n-doped cathode zone and a p-doped anode zone;
            a first dielectric section extending from the bottom side to the top side, the first dielectric section being arranged between the cathode zone on one side and both the drift zone and the drain zone on another side;
        a drain contact terminal arranged on the top side;
        a source contact terminal arranged on the bottom side;
        a gate contact terminal; and
        a temperature sense contact terminal arranged on the top side and dielectrically insulated from the drain contact terminal;
        wherein either
            (I) the first conduction type is 'n' and the second conduction type is 'p', the anode zone is electrically connected to the source contact terminal, and the cathode zone is electrically connected to the temperature sense contact terminal; or (II) the first conduction type is 'p' and the second conduction type is 'n', the cathode zone is electrically connected to the source contact terminal, and the anode zone is electrically connected to the temperature sense contact terminal; and (b) an evaluation unit configured to evaluate a temperature dependent voltage drop across the pn-junction, the evaluation unit comprising an input electrically connected to the temperature sense contact terminal.

11. The power transistor circuit as claimed in claim 10, further comprising a current source electrically connected to a circuit node between the temperature sense contact terminal and the input of the evaluation unit.

12. The power transistor circuit as claimed in claim 11, wherein the current source is a constant current source.

13. The power transistor circuit as claimed in claim 10, further comprising:
a first supply potential electrically connected to the source contact terminal;
a second supply potential that is positive relative to the first supply potential;
a third supply potential electrically connected to the temperature sense contact terminal, the third supply potential being positive relative to the first supply potential;
an electric load electrically connected between the drain contact terminal and the second supply potential; and
a current source electrically connected between the third supply potential and the temperature sense contact terminal.

14. The power transistor circuit as claimed in claim 13, further comprising a temperature evaluation unit comprising a first input electrically connected to the temperature sense contact terminal.

15. The power transistor circuit as claimed in claim 10, further comprising:
a first supply potential;
a second supply potential;
a third supply potential that is positive relative to both the first and second supply potentials;
an electric load electrically connected between the source contact terminal and the first supply potential; and
a current source electrically connected between the temperature sense contact terminal and the second supply potential.

16. The power transistor circuit as claimed in claim 15, further comprising a temperature evaluation unit comprising a first input electrically connected to the temperature sense contact terminal.

17. The power transistor circuit as claimed in claim 16, further comprising a reference constant voltage source electrically connected between a second input of the temperature evaluation unit and the source contact terminal.

18. The power transistor circuit as claimed in claim 10, further comprising:
a first supply potential electrically connected via a load to the source contact terminal;
a second supply potential that is positive relative to the first supply potential; and
a current source electrically connected between the temperature sense contact terminal and a gate contact terminal of the power transistor.

19. The power transistor circuit as claimed in claim 18, further comprising a temperature evaluation unit comprising an input electrically connected to the temperature sense contact terminal.

20. The power transistor circuit as claimed in claim 10, wherein the gate contact terminal is arranged on the top side.

21. A method for operating a power transistor, the method comprising:
providing a power transistor comprising:
a semiconductor body comprising:
a bottom side and a top side spaced distant from the bottom side in a vertical direction;
a plurality of transistor cells;
a source zone of a first conduction type;
a body zone of a second conduction type complementary to the first conduction type;
a drift zone of the first conduction type;
a drain zone;
a temperature sensor diode comprising a pn-junction formed between an n-doped cathode zone and a p-doped anode zone;
a first dielectric section extending from the bottom side to the top side, the first dielectric section being arranged between the cathode zone on one side and both the drift zone and the drain zone on another side;
a drain contact terminal arranged on the top side;
a source contact terminal arranged on the bottom side;
a gate contact terminal; and
a temperature sense contact terminal arranged on the top side and dielectrically insulated from the drain contact terminal;
wherein either
(I) the first conduction type is 'n' and the second conduction type is 'p', the anode zone is electrically connected to the source contact terminal, and the cathode zone is electrically connected to the temperature sense contact terminal; or
(II) the first conduction type is 'p' and the second conduction type is 'n', the cathode zone is electrically connected to the source contact terminal, and the anode zone is electrically connected to the temperature sense contact terminal; and
detecting a temperature dependent voltage drop across the pn-junction.

22. The method as claimed in claim 21, wherein the temperature at the pn-junction is determined from the voltage drop.

23. The method as claimed in claim 21, wherein a control signal is produced if the temperature that corresponds to the voltage drop attains or exceeds a predefined value.

24. The method as claimed in claim 23, wherein the power transistor is switched off if the control signal occurs.

25. The method as claimed in claim 21, wherein the temperature dependent voltage drop across the pn-junction is detected with the pn-junction being operated forward-biased.

26. The method as claimed in claim 21, wherein the temperature dependent voltage drop across the pn-junction is detected with the pn-junction being operated reverse-biased.

27. The method as claimed in claim 21, wherein the temperature dependent voltage drop across the pn-junction is detected when a load path formed between the drain contact terminal and the source contact terminal is in an electrically conductive state.

* * * * *